(12) United States Patent
Schwarz et al.

(10) Patent No.: US 9,780,269 B2
(45) Date of Patent: Oct. 3, 2017

(54) OPTOELECTRONIC SEMICONDUCTOR COMPONENT COMPRISING AN OPTOELECTRONIC SEMICONDUCTOR CHIP BEING PARTLY EMBEDDED IN A SHAPED BODY SERVING AS SUPPORT AND METHOD FOR PRODUCING AN OPTOELECTRONIC SEMICONDUCTOR COMPONENT COMPRISING AN OPTOELECTRONIC SEMICONDUCTOR CHIP BEING PARTLY EMBEDDED IN A SHAPED BODY SERVING AS SUPPORT (71) Applicant: OSRAM Opto Semiconductors GmbH, Regensburg (DE)

(72) Inventors: Thomas Schwarz, Regensburg (DE); Frank Singer, Regenstauf (DE); Jürgen Moosburger, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/022,535

(22) PCT Filed: Aug. 25, 2014

(86) PCT No.: PCT/EP2014/068001
§ 371 (c)(1),
(2) Date: Mar. 16, 2016

(87) PCT Pub. No.: WO2015/043851
PCT Pub. Date: Apr. 2, 2015

(65) Prior Publication Data
US 2016/0225964 A1     Aug. 4, 2016

(30) Foreign Application Priority Data
Sep. 27, 2013 (DE) .................. 10 2013 110 733

(51) Int. Cl.
  *H01L 33/00*     (2010.01)
  *H01L 33/54*     (2010.01)
  (Continued)

(52) U.S. Cl.
  CPC .......... *H01L 33/54* (2013.01); *H01L 33/0095* (2013.01); *H01L 33/486* (2013.01);
  (Continued)

(58) Field of Classification Search
  None
  See application file for complete search history.

(56) References Cited

U.S. PATENT DOCUMENTS 6,770,960 B2   8/2004  Oohata
6,919,232 B2   7/2005  Hedler et al.
(Continued)

FOREIGN PATENT DOCUMENTS

CN     101794852 A    8/2010
DE     10156386 A1    6/2003
(Continued)

*Primary Examiner* — Cory Eskridge
(74) *Attorney, Agent, or Firm* — Slater Matsil, LLP (57) ABSTRACT

An optoelectronic semiconductor component includes an optoelectronic semiconductor that is partly embedded into a shaped body, which is formed from a molding compound that at least partly covers at least two lateral faces and the rear surface of the optoelectronic semiconductor chip. A first contact layer and a second contact layer are arranged on the shaped body and are electrically connected to the optoelectronic semiconductor chip. A mounting face is arranged transversely in relation to the radiation passage face and is provided for mounting the optoelectronic semiconductor component.

18 Claims, 8 Drawing Sheets

(51) Int. Cl.
    *H01L 33/62*    (2010.01)
    *H01L 33/48*    (2010.01)
    *H01L 33/52*    (2010.01)

(52) U.S. Cl.
    CPC .............. *H01L 33/62* (2013.01); *H01L 33/52*
        (2013.01); *H01L 2224/19* (2013.01); *H01L*
        *2224/96* (2013.01); *H01L 2933/005* (2013.01);
        *H01L 2933/0033* (2013.01); *H01L 2933/0066*
                                                    (2013.01)

(56) References Cited

U.S. PATENT DOCUMENTS

| | | |
|---|---|---|
| 6,933,208 B2 | 8/2005 | Yanagisawa et al. |
| 6,995,029 B2 | 2/2006 | Sorg et al. |
| 7,521,782 B2 | 4/2009 | Ishii |
| 8,227,824 B2 | 7/2012 | Kim |
| 8,431,951 B2 | 4/2013 | Zhang et al. |
| 2003/0160258 A1 | 8/2003 | Oohata |
| 2005/0194606 A1* | 9/2005 | Oohata ................ H01L 24/24 257/99 |
| 2006/0154444 A1 | 7/2006 | Yanagisawa et al. |
| 2011/0079801 A1* | 4/2011 | Zhang ................ H01L 31/0203 257/98 |

FOREIGN PATENT DOCUMENTS

| | | |
|---|---|---|
| DE | 10306557 A1 | 2/2004 |
| DE | 112004002138 B4 | 6/2011 |
| DE | 102010046257 A1 | 3/2012 |
| DE | 112006003435 B4 | 4/2012 |
| DE | 102011077898 A1 | 12/2012 |
| JP | H0621268 A | 1/1994 |
| JP | H08242019 A | 9/1996 |
| JP | H10150138 A | 6/1998 |
| JP | 2000196000 A | 7/2000 |
| JP | 2002313914 A | 10/2002 |
| JP | 2003168762 A | 6/2003 |
| JP | 2004127962 A | 4/2004 |
| JP | 2004363279 A | 12/2004 |
| JP | 3907145 B2 | 4/2007 |
| JP | 2013506985 A | 2/2013 |

* cited by examiner

OPTOELECTRONIC SEMICONDUCTOR COMPONENT COMPRISING AN OPTOELECTRONIC SEMICONDUCTOR CHIP BEING PARTLY EMBEDDED IN A SHAPED BODY SERVING AS SUPPORT AND METHOD FOR PRODUCING AN OPTOELECTRONIC SEMICONDUCTOR COMPONENT COMPRISING AN OPTOELECTRONIC SEMICONDUCTOR CHIP BEING PARTLY EMBEDDED IN A SHAPED BODY SERVING AS SUPPORT

This patent application is a national phase filing under section 371 of PCT/EP2014/068001, filed Aug. 25, 2014, which claims the priority of German patent application 10 2013 110 733.8, filed Sep. 27, 2013, each of which is incorporated herein by reference in its entirety.

TECHNICAL FIELD

Embodiments of the invention relate to an optoelectronic semiconductor component and method for producing an optoelectronic semiconductor component.

SUMMARY

An optoelectronic semiconductor component with an optoelectronic semiconductor chip is specified. In particular embodiments, the optoelectronic semiconductor component is a radiation-emitting semiconductor component that takes the form of a side emitter.

Furthermore, a method for producing an optoelectronic semiconductor component is specified. In particular embodiments, the method is based on so-called CiF technology (CiF: chip in a frame), the optoelectronic semiconductor chip being partly embedded into a shaped body which serves as support.

Embodiments of the present application specify a mechanically stable optoelectronic semiconductor component that is suitable for lateral emission or absorption of radiation. Further embodiments specify a method for producing a mechanically stable optoelectronic semiconductor component that is suitable for lateral emission or absorption of radiation.

According to at least one embodiment, the optoelectronic semiconductor component includes an optoelectronic semiconductor chip with a radiation passage face, with several lateral faces, which are arranged transversely in relation to the radiation passage face, and with a rear surface arranged opposite the radiation passage face. In particular, the radiation passage face is characterized in that a large part of the radiation that, for example, is generated in operation by the optoelectronic semiconductor chip passes through it. In particular, the radiation passage face of the semiconductor chip forms a part of a radiation-passage-side surface of the semiconductor component. The semiconductor component on the radiation passage side is preferentially bounded toward the outside by the radiation-passage-side surface.

The optoelectronic semiconductor element preferentially includes a shaped body which is formed from a molding compound. The molding compound may contain a plastic material, for example, a thermosetting plastic material such as epoxide or a silicone. Furthermore, the molding compound may comprise a filler, for example, amorphous silicon dioxide, boron nitride or aluminum oxide. In particular, the proportion of the filler in the molding compound amounts to at least 50 percent by weight. Moreover, the molding compound may contain additives such as white pigments or carbon black, which impart to the shaped body a characteristic color such as white or black. In particular, the proportion of the additives in the molding compound amounts to 10 to 15 percent by weight.

According to at least one embodiment, the optoelectronic semiconductor chip is partly embedded into the shaped body, in which case the molding compound at least partly covers at least two lateral faces and the rear surface of the semiconductor chip. In particular, the covered lateral faces are arranged to be opposing. Advantageously, the shaped body forms a support for the optoelectronic semiconductor chip. The shaped body accordingly contributes to the mechanical stability of the optoelectronic semiconductor component. The shaped body may comprise a radiation-passage-side main area, a rear main area and several lateral faces. In particular, the shaped body is bounded on the radiation passage side of the semiconductor component by the radiation-passage-side main area, on the rear side by the rear main area, and peripherally by the lateral faces. In particular, the radiation-passage-side main area of the shaped body forms a part of the radiation-passage-side surface of the semiconductor component.

Moreover, the optoelectronic semiconductor component may comprise a first contact layer and a second contact layer which are arranged on the shaped body and are provided for electrical connection of the semiconductor chip. In particular, the optoelectronic semiconductor chip may comprise a first and a second electrical contact, which are provided for electrical connection of the semiconductor chip, the first electrical contact is connected to the first contact layer, and the second electrical contact is connected to the second contact layer. In particular, the contact layers enable a wireless contacting of the semiconductor chip.

Moreover, the optoelectronic semiconductor component may comprise a mounting face which is arranged transversely in relation to the radiation passage face of the semiconductor chip and is provided for mounting the semiconductor component. As a result of this, the semiconductor component takes the form, in particular, of a side emitter if the semiconductor chip is a radiation-emitting semiconductor chip. A side emitter of such a type is suitable, in particular, for lateral coupling of light into a light guide of a display.

For example, the optoelectronic semiconductor component with the mounting face may be arranged on a connection support. For fastening the semiconductor component, the latter may be provided with a connecting means, in particular a solder, along edges of the mounting face. The connecting means may be arranged on the radiation-passage-side surface, on two opposing lateral faces which, in particular, are arranged transversely in relation to the connection support, and on a rear surface of the optoelectronic semiconductor component. Moreover, the connecting means is preferentially arranged between the mounting face and the connection support. The connecting means preferentially covers the contact layers at least partly, so that the latter are electrically connected to the connection support by the connecting means. In particular, proceeding from the radiation-passage-side surface, the contact layers extend along the stated faces via the lateral faces as far as the rear surface of the optoelectronic semiconductor component. Moreover, the contact layers may extend onto the mounting face, so that the semiconductor component can also be electrically connected to the mounting face.

According to a preferred embodiment, the shaped body includes a projecting portion which is arranged on a lateral face of the semiconductor chip and comprises a first and a second dimension which are each larger than a smallest dimension of the semiconductor chip. In particular, the shaped body comprises a further projecting portion which is arranged opposite the other portion and is located on a further lateral face of the semiconductor chip. Advantageously, the further portion also comprises a first and a second dimension which are each larger than a smallest dimension of the semiconductor chip. In particular, the first and the second dimension of the portion are determined along a first and second principal direction of extent, a plane in which the mounting face is arranged being spanned by the two principal directions of extent. By means of the two portions, the optoelectronic semiconductor component can be supported on the mounting face.

According to at least one embodiment of the optoelectronic component, the first and the second dimension of the projecting portion are at least twice as large as the smallest dimension of the semiconductor chip. This preferentially also holds for the further portion. For example, the smallest dimension of the semiconductor chip may be a thickness of the semiconductor chip measured parallel to the first principal direction of extent, which thickness amounts, in particular, to between 0.1 mm and 0.2 mm. Moreover, the first dimension of the projecting portion may amount to between 0.2 mm and 2 mm. Furthermore, the second dimension may amount to between 0.3 mm and 3 mm.

In addition, in an advantageous configuration of the projecting portion the first and the second dimension are at most as large as a largest dimension of the semiconductor chip. For example, the semiconductor chip may comprise the largest dimension in the second principal direction of extent.

According to at least one embodiment, the first contact layer extends from the radiation-passage-side main area onto a lateral face of the shaped body, the lateral face is arranged transversely in relation to the mounting face. Moreover, the second contact layer may extend from the radiation-passage-side main area onto a further lateral face of the shaped body, the further lateral face also is arranged transversely in relation to the mounting face. Furthermore, the first and the second contact layer may extend over the respective lateral faces as far as the rear main area of the shaped body. In particular, the lateral faces are completely covered by the respective contact layers.

In a preferred configuration of the optoelectronic semiconductor component, the shaped body comprises an opening that extends from the rear surface of the optoelectronic semiconductor chip as far as the rear main area of the shaped body. The opening enables an electrical contacting of the semiconductor chip on its rear surface.

For example, the opening may taper, proceeding from the rear main area of the shaped body as far as the rear surface of the optoelectronic semiconductor chip. This means that a cross-sectional area of the opening becomes smaller, proceeding from the rear main area of the shaped body as far as the rear surface of the optoelectronic semiconductor chip.

The opening is preferentially bounded on its underside by the rear surface of the semiconductor chip, and peripherally at least partly by at least one internal surface of the shaped body. For example, the opening may be bounded by a closed internal surface. In this case, the opening is completely enclosed peripherally by the shaped body. Moreover, it is conceivable that the opening extends from a first lateral face, for example, the mounting face, as far as a second lateral face situated opposite the first lateral face, the second lateral face being situated, for example, opposite the mounting face. The opening is then bounded not by a closed internal surface but, for example, by two unconnected internal surfaces.

In an advantageous configuration, the first contact layer extends from the rear main area of the shaped body right into the opening. In particular, the first contact layer extends from the radiation-passage-side main area, via a lateral face arranged transversely in relation to the mounting face and via the rear main area, right into the opening. The contact layer is preferably applied onto the internal surface of the shaped body and onto the rear surface of the optoelectronic semiconductor chip.

According to a preferred further development, a filling is arranged in the opening. For example, the filling may be formed from the same molding compound as the shaped body. By virtue of the filling, the semiconductor component gains further stability. The first contact layer is preferentially arranged between the filling and the shaped body. Moreover, the first contact layer is arranged between the semiconductor chip and the filling.

According to at least one embodiment of the optoelectronic semiconductor component, the shaped body is formed in a single layer. This means, in particular, that no interfaces appear within the shaped body.

Alternatively, the shaped body may be formed in two layers. This means, in particular, that within the shaped body an interface is formed which separates a first layer of the shaped body from a second layer. In particular, the first and the second layer are formed by the same molding compound. However, it is also conceivable to use different molding compounds for the two layers. In an advantageous configuration, the semiconductor component comprises a third contact layer which is arranged between the first and the second layer. The third contact layer forms an interface between the first and the second layer of the shaped body. The first contact layer and the rear surface of the semiconductor chip are preferentially connected to one another by means of the third contact layer. In particular, the first contact layer and the rear surface of the semiconductor chip are connected to one another mechanically and electrically by means of the third contact layer.

According to at least one embodiment, at least a part of the mounting face of the semiconductor component is formed by a lateral face of the shaped body. Moreover, a part of the mounting face of the semiconductor component may be formed by a lateral face of the optoelectronic semiconductor chip. If the lateral face of the optoelectronic semiconductor chip is covered with molding compound, the mounting face of the semiconductor component is preferentially formed only by the lateral face of the shaped body. Moreover, a part of the mounting face may be formed by at least one of the two contact layers which extend onto the mounting face. In particular, at least one of the two contact layers may extend onto that lateral face of the shaped body which forms at least a part of the mounting face.

According to at least one embodiment, for the optoelectronic semiconductor component an optoelectronic semiconductor chip is used that comprises a succession of semiconductor layers with an active zone and preferentially with further functional layers. The succession of semiconductor layers can be grown on a growth substrate by means of an epitaxial process, for example, by means of metalorganic vapor-phase epitaxy (MOVPE) or molecular-beam epitaxy (MBE). In the present case, it is preferentially a question of a thin-film semiconductor chip. This means, in particular, that after the growth of the succession of semiconductor layers the growth substrate is greatly thinned or is completely removed from the succession of semiconductor layers. The succession of semiconductor layers may be arranged on a substitute substrate.

According to at least one embodiment, the succession of semiconductor layers is not covered by the molding compound of the shaped body. A substrate surface of a substrate, on which the succession of semiconductor layers is arranged, is preferentially also not covered by the molding compound of the shaped body. Hence on the radiation passage side of the semiconductor component the shaped body preferentially does not project beyond the succession of semiconductor layers and, in particular, not beyond the substrate surface of the semiconductor chip. Further surfaces of the substrate may be positively embedded into the shaped body. In particular, lateral faces of the substrate are covered by the molding compound.

In an advantageous configuration, the optoelectronic semiconductor component does not have an additional housing. This means that the optoelectronic semiconductor chip, which is stabilized by the shaped body, can be arranged on a connection support without a further housing.

For example, a grouting, in particular a clear grouting, can be applied onto the succession of semiconductor layers.

The succession of semiconductor layers may, for example, are formed from a material based on $In_xGa_yAl_{1-x-y}N$, where $0 \leq x \leq 1$ and $0 \leq y \leq 1$ holds in each instance. The succession of semiconductor layers is suitable, in particular, for emitting short-wave visible radiation, in particular from green to blue.

According to at least one embodiment, the optoelectronic semiconductor component is suitable for emitting mixed-color radiation. For this purpose the semiconductor component comprises, in particular, a conversion element which is arranged on the radiation passage face of the optoelectronic semiconductor chip. In the chip, a radiation exit face of the conversion element forms a part of the radiation-passage-side surface of the semiconductor component.

In an advantageous configuration, the first electrical contact and the second electrical contact are arranged on the substrate on which the succession of semiconductor layers is arranged. In particular, the first and the second contact layer terminate on a surface of the substrate. Advantageously, the radiation passage face is free of radiation-absorbing contact layers and contacts. For example, the first contact layer may terminate on a rear substrate surface. However, it is also possible that the first contact layer terminates on a front substrate surface. Moreover, the second contact layer may also terminate on a front substrate surface. In an advantageous configuration, the rear surface of the semiconductor chip is formed by the rear substrate surface. The succession of semiconductor layers is preferentially arranged on the front substrate surface.

A method for producing an optoelectronic semiconductor component has, according to at least one embodiment, the following steps:

making available a composite consisting of several optoelectronic semiconductor chips which are arranged with their radiation passage faces on a common support, embedding the optoelectronic semiconductor chips into a molding compound, so that the lateral faces and rear surfaces of the semiconductor chips are covered by the molding compound, a projecting portion of the molding compound is assigned to each semiconductor chip, the portion is arranged on a lateral face of the semiconductor chip and comprising a first and a second dimension which are each larger than a smallest dimension of the semiconductor chip, detaching the common support, applying first and second metallizations onto the molding compound for forming first and second contact layers, separation into several optoelectronic semiconductor components.

According to at least one embodiment of the method, the molding compound is applied onto the semiconductor chips by spraying or casting. Application of the molding compound is preferentially undertaken in a transfer-molding process, for example, a sheet transfer-molding process.

According to at least one embodiment of the method, the metallizations are generated galvanically. For example, for generating the metallizations firstly a seed layer, for example, consisting of titanium or copper, can be applied onto the molding compound, and a metal layer, for example, consisting of copper, can be electrodeposited on the seed layer. For producing the contact layers, the metallizations can be applied in already structured form or can be structured after formation of the metallizations.

According to at least one embodiment of the method, the molding compound is applied onto the semiconductor chips as a continuous closed layer and, except for the division into several molded bodies, is not structured any further.

Alternatively, the molding compound can be applied onto the semiconductor chips as a closed layer, and openings can be generated in the molding compound. In particular, in this case the openings extend as far as the rear surfaces of the optoelectronic semiconductor chips. The openings can be generated by removing the molding compound, for example, by means of laser ablation.

Furthermore, the molding compound can be applied as an interrupted layer. For example, the molding compound can be applied selectively, in which case selected regions of the semiconductor chips are recessed. In particular, the rear surfaces of the semiconductor chips are covered at most partly by the molding compound.

In a further configuration, for producing openings a structured sacrificial layer is used which covers regions of the semiconductor chips on which no molding compound is to be applied. After embedding of the semiconductor chips into the molding compound, the sacrificial layer is preferentially removed, in which case openings arise in regions of the detached sacrificial layer.

BRIEF DESCRIPTION OF THE DRAWINGS

Further advantages, advantageous embodiments and further developments result from the exemplary embodiments described in the following in connection with the figures.

FIG. 1A shows a schematic side view.

DETAILED DESCRIPTION OF ILLUSTRATIVE EMBODIMENTS

Figure 1A:
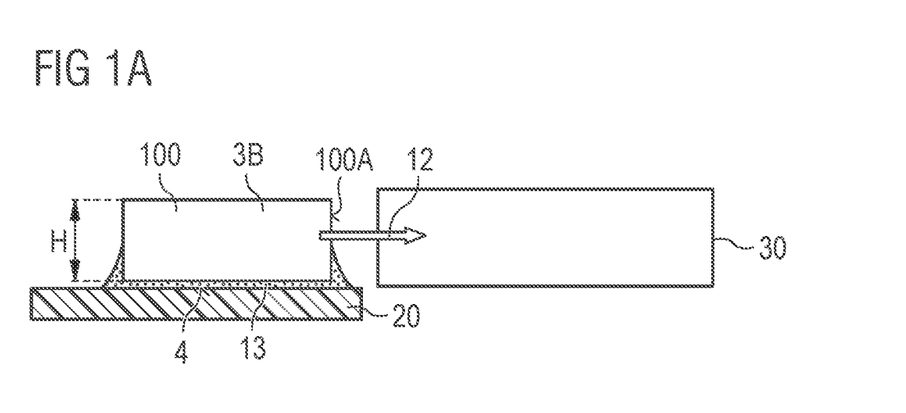
Figure 1B:
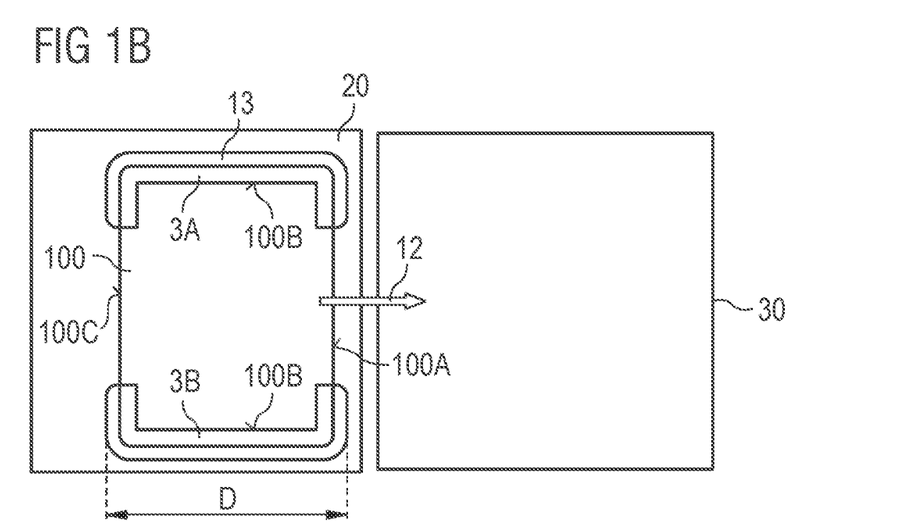
FIG. 1B shows a schematic top view, of an arrangement including an optoelectronic semiconductor component described herein.

FIGS. 1A and 1B illustrate a possible arrangement with an optoelectronic semiconductor component 100 described herein. The semiconductor component 100 is, in particular, a radiation-emitting semiconductor component. The optoelectronic semiconductor component 100 is arranged with its mounting face 4 on a connection support 20. Located between the optoelectronic semiconductor component 100 and the connection support 20 is a connecting means 13 for fastening the semiconductor component 100 to the connection support 20. As represented in FIG. 1B, the connecting means 13 may be arranged along edges of the mounting face 4. In particular, the connecting means 13 is arranged on a radiation-passage-side surface 100A, on two opposing lateral faces 100B, and on a rear surface 100C of the optoelectronic semiconductor component 100. Furthermore, the semiconductor component 100 comprises a first and a second contact layer 3A, 3B which, corresponding to the connecting means 13, proceeding from the radiation-passage-side surface 100A via the lateral faces 100B onto the rear surface 100C of the optoelectronic semiconductor component 100, extend along the stated surfaces. In particular, the contact layers 3A, 3B are connected to the connection support 20 mechanically and in electrically conducting manner by the connecting means 13.

The optoelectronic semiconductor component 100 emits a large part of the generated radiation through the radiation-passage-side surface 100A which is arranged transversely in relation to the mounting face 4. A principal radiating direction 12, in which the greater part of the generated radiation is emitted, runs perpendicular to a radiation passage face 1A of the optoelectronic semiconductor chip 1 (see FIG. 2A).

In this arrangement the radiation is laterally coupled into a light guide 30.

The optoelectronic semiconductor component 100 may be designed to be comparatively flat and is therefore particularly suitable to form a flat backlighting array which can be used for a display, for example. In particular, the optoelectronic semiconductor component 100 has a height H between 0.2 mm and 0.4 mm. Furthermore, the optoelectronic semiconductor component 100 is designed to be comparatively narrow with a thickness D of about 0.2 mm.

Figure 2A:
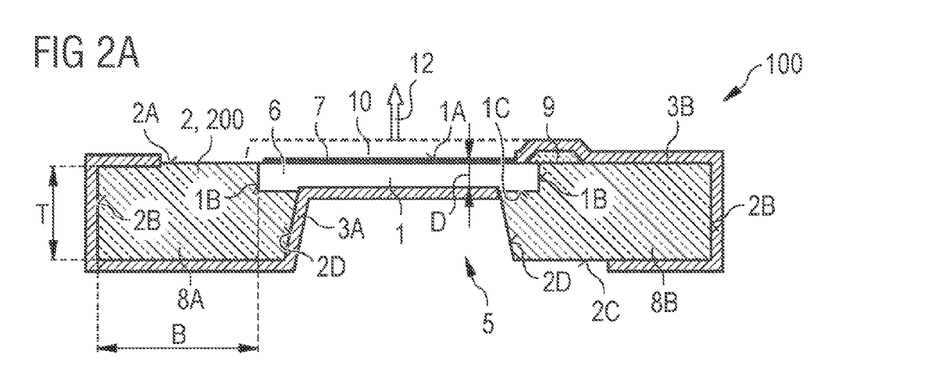
FIG. 2A shows a schematic top view of a lateral face, situated opposite the mounting face, of an optoelectronic semiconductor component according to the various exemplary embodiments.
Figure 2B:
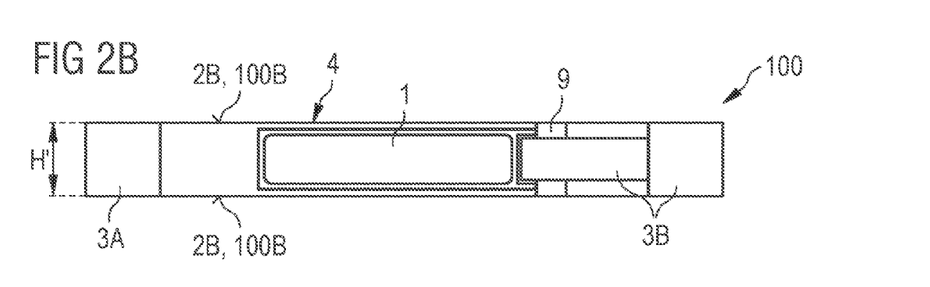
FIGS. 2B to 2D show schematic top views of the radiation-passage-side surface of an optoelectronic semiconductor component according to various exemplary embodiments.
Figure 2C:
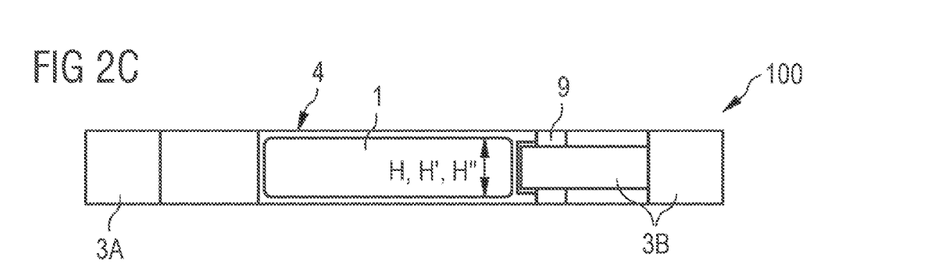
Figure 2D:
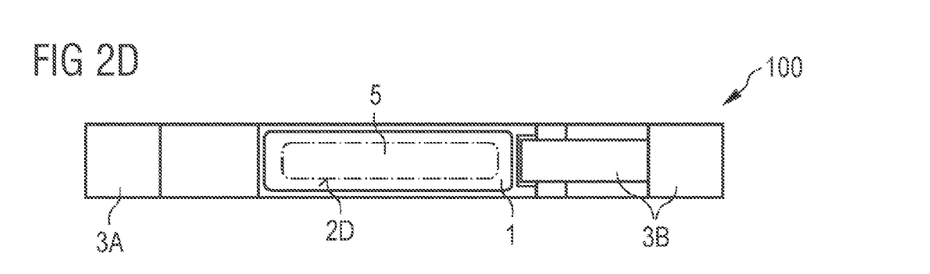

Various exemplary embodiments of an optoelectronic semiconductor component 100 are represented in FIGS. 2B, 2C and 2D. The semiconductor component 100 comprises an optoelectronic semiconductor chip 1 and a shaped body 2 formed from a molding compound 200, into which the optoelectronic semiconductor chip 1 is partly embedded. The shaped body 2 comprises a radiation-passage-side main area 2A, several lateral faces 2B and a rear main area 2C.

Moreover, the optoelectronic semiconductor chip 1 comprises a radiation passage face 1A, through which a large part of the generated radiation passes, and several lateral faces 1B, which are arranged transversely in relation to the radiation passage face 1A, and also a rear surface 1C arranged opposite the radiation passage face 1A. At least two lateral faces 1B of the semiconductor chip 1 are covered by the molding compound 200. For example, all four lateral faces 1B may be covered by the molding compound 200 (see FIG. 2B). Alternatively, at most three lateral faces 1B may be covered by the molding compound 200. For example, the lateral face 1B arranged on the mounting face 4 may not are covered by molding compound, so that this lateral face 1B forms a part of the mounting face 4. Moreover, the lateral face 1B situated opposite the mounting face 4 may also not are covered by molding compound (see FIG. 2C). In particular, the semiconductor component 100 in this case has a height H that corresponds to the height H' of the semiconductor chip 1.

In the exemplary embodiments shown in FIGS. 2A to 2D, the rear surface 1C is only partly covered by the molding compound. In particular, the shaped body 2 comprises an opening 5 that extends from the rear surface 1C of the optoelectronic semiconductor chip 1 as far as the rear main area 2C of the shaped body 2. The opening 5 tapers, proceeding from the rear main area 2C of the shaped body 2 as far as the rear surface 1C of the optoelectronic semiconductor chip 1.

The opening 5 is bounded on its underside by the rear surface 1C of the semiconductor chip 1, and peripherally by at least one internal surface 2D of the shaped body 2.

A possible configuration of the opening 5 is represented in FIG. 2D. The opening 5 in this case is bounded peripherally by a closed internal surface 2D of the shaped body 2. The opening 5 takes the form of an elongated hole and, in particular, has a greater extent parallel to the mounting face 4 than perpendicular to the mounting face 4.

Alternatively, the opening 5 may be bounded by two unconnected internal surfaces of the shaped body 2 (not represented). In this case, the opening 5 may extend from the mounting face 4 as far as the lateral face 100B of the semiconductor component 100 situated opposite the mounting face 4.

The optoelectronic semiconductor component 100 includes a first contact layer 3A and a second contact layer 3B, which are arranged on the shaped body 2 and are provided for electrical connection of the semiconductor chip 1. The two contact layers 3A, 3B extend from the front main area 2A, respectively via a lateral face 2B, onto the rear main area 2C of the shaped body 2. Furthermore, the first contact layer 3A extends from the rear main area 2C of the shaped body 2 right into the opening 5. The first contact layer 3a is applied onto an internal surface 2D of the shaped body 2 and onto the rear surface 1C of the optoelectronic semiconductor chip 1. In particular, the first contact layer 3A terminates on the rear surface 1C and is connected to a first electrical contact (not represented) of the semiconductor chip 1. The semiconductor chip 1 preferentially includes a substrate 6 and a succession of semiconductor layers 7 arranged on the substrate 6. The first electrical contact is provided for electrical connection of a first semiconductor region (not represented) arranged on a side of the succession of semiconductor layers 7 facing toward the substrate 6. Furthermore, the semiconductor chip 1 comprises a second electrical contact (not represented) which is provided for electrical connection of a second semiconductor region (not represented) arranged on a side of the succession of semiconductor layers 7 facing away from the substrate 6. In particular, the first contact is a p-contact, and the first semiconductor region is a p-conducting semiconductor region. Moreover, the second contact is preferentially an n-contact, and the second semiconductor region is preferentially an n-conducting semiconductor region.

For example, the succession of semiconductor layers 7 may comprise an active zone which is provided with at least one electrically conducting aperture which enables an electrical contacting of the second semiconductor region, proceeding from the substrate 6 (not represented). In this case the second contact layer 3B preferentially terminates on the substrate 6. Similarly, the first semiconductor region can be electrically connected via the substrate 6. By virtue of the substrate-side contacting of the semiconductor chip 1, the radiation passage face 1A can remain free of radiation-absorbing contact structures.

The shaped body 2 includes a first projecting portion 8A and a second projecting portion 8B, which are each arranged on a lateral face 1B of the semiconductor chip 1. The projecting portions 8a, 8b each comprise a first and second dimension which are each larger than a smallest dimension of the semiconductor chip 1. The first dimension T is, in particular, the depth of the projecting portions 8A, 8B, and the second dimension B is the width of the projecting portions 8A, 8B. For example, the first dimension T of the projecting portions 8A, 8B may amount to between 0.2 mm and 2 mm. Furthermore, the second dimension B may amount to between 0.3 mm and 3 mm. Furthermore, a height H' may amount to between 0.2 mm and 0.4 mm (see FIG. 2B).

For example, the smallest dimension of the semiconductor chip may specify the thickness D thereof, which, in particular, amounts to between 0.1 mm and 0.2 mm.

The optoelectronic semiconductor component 100 preferentially includes, in an end region, connected to the semiconductor chip 1, of the second contact layer 3B, a passivation layer 9 which is arranged between the second contact layer 3B and the optoelectronic semiconductor chip 1. By means of the passivation layer 9, the second contact layer 3B can be electrically isolated in relation to the substrate 6. For example, the passivation layer 9 may be formed from an organic material, in particular a synthetic substance. Advantageously, the second contact layer 3B is designed to be narrower in the end region than in a transition region adjoining the lateral face 2B, in which the radiation-passage-side main area 2A is, in particular, completely covered by the second contact layer 3B (see 2B to 2D). The first contact layer 3A in the transition region between the lateral face 2B and the radiation-passage-side main area 2A preferentially also covers the latter completely (see 2B to 2D). However, the first contact layer 3A does not reach as far as the semiconductor chip 1 but terminates on the radiation-passage-side main area 2A.

Electrical contacting of the optoelectronic semiconductor component 100 is undertaken from outside by means of the first and second contact layers 3A, 3B, the connecting means 13 is arranged at least peripherally—that is to say, along edges that bound the mounting face 4 (see FIG. 1B in this regard). Moreover, at least one of the two contact layers 3A, 3B may extend onto the mounting face 4, in which case the connecting means 13 is then also arranged, in particular, between the mounting face 4 and the connection support (not represented).

The semiconductor component 100 may, as represented in FIG. 2A, include a conversion element 10 which is arranged on the radiation passage face 1A of the semiconductor chip 1. The radiation passing through the radiation passage face 1A of the semiconductor chip 1 can be wavelength-converted by means of the conversion element 10. The semiconductor chip 1 preferentially emits radiation having a wavelength range in the ultraviolet to blue region of the spectrum. Moreover, the conversion element 10 is able to transform the radiation emitted by the semiconductor chip 1 into radiation having a wavelength range in the green to red region of the spectrum. For example, the optoelectronic semiconductor component 100 may be suitable to emit white light.

The optoelectronic semiconductor component 100 as represented in FIGS. 2A to 2D is designed to be particularly flat. In addition to this, the shaped body 2 or the projecting portions 8a, 8b provided with suitable dimensions impart(s) sufficient stability to the semiconductor component 100, so that the semiconductor component 100 can be mounted transversely in relation to the radiation passage face 1A, and hence takes the form of a side emitter.

Figure 3:
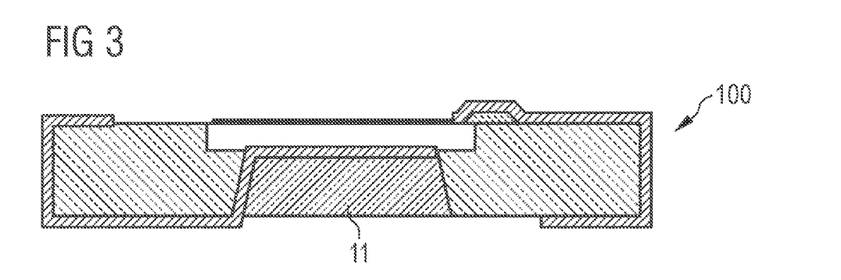
FIG. 3 shows a schematic top view of a lateral face, situated opposite the mounting face, according to a further exemplary embodiment.

In connection with FIG. 3, a further exemplary embodiment of an optoelectronic semiconductor component 100 is represented. This component is similar to the semiconductor components 100 represented in FIGS. 2A to 2D. In contrast thereto, a filling 11 is arranged in the rear opening 5. In this case, the opening 5 is completely filled out by the filling 11. However, it is also conceivable that the filling 11 fills out only a part of the opening 5. The filling 11 is formed, in particular, from the same material as the molding compound. The filling can be produced, for example, by means of spraying, casting or dispensing. By virtue of the filling 11, the stability of the semiconductor component 100 can be further enhanced.

Figure 4A:
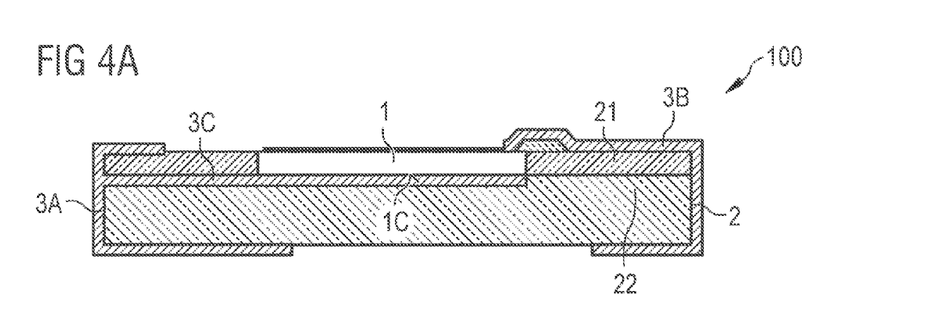
FIG. 4A shows a schematic top view of a lateral face situated opposite the mounting face.
Figure 4B:
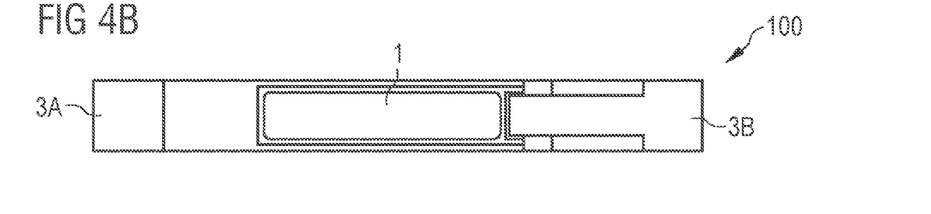
FIG. 4B shows a schematic top view of the radiation-passage-side surface of an optoelectronic semiconductor component according to a further exemplary embodiment.

In the exemplary embodiment represented in connection with FIGS. 4A and 4B the shaped body 2 is formed in two layers. In this case, in a first production step the optoelectronic semiconductor chip 1 is preferentially embedded into a molding compound, in which case the lateral faces 1B and the rear surface 1C of the semiconductor chip 1 are completely covered by the molding compound. The molding compound can then be abraded parallel to the rear surface 1C of the semiconductor chip 1 until the rear surface 1C of the semiconductor chip 1 is not covered by molding compound. In particular, this is done by grinding the molding compound back. The remaining molding compound forms a first layer 21 of the finished shaped body 2. A third contact layer 3C can be applied onto the first layer 21 and onto the rear surface 1C of the semiconductor chip 1. Subsequently a second layer 22, which can be produced from the same molding compound as the first layer 21 or from a different molding compound, is applied onto the first layer 21 and onto the semiconductor chip 1 embedded therein. Between the first and second layers 21, 22 the two-layer shaped body 2 comprises an interface formed by the third contact layer 3C. The third contact layer 3C is connected to the first contact layer 3A and establishes an electrical connection between the first contact layer 3A and the semiconductor chip 1.

Figure 5A:
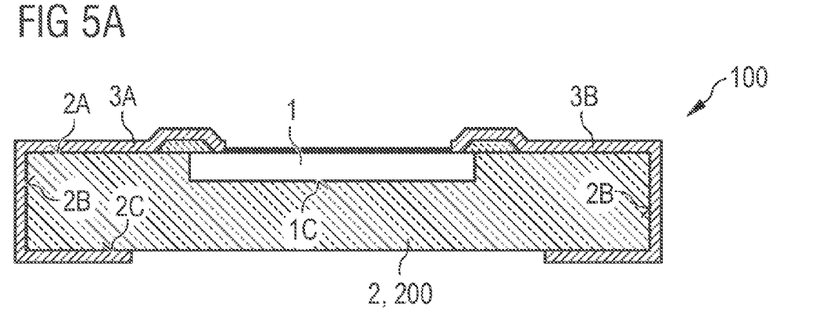
FIG. 5A shows a schematic top view of a lateral face situated opposite the mounting face.
Figure 5B:
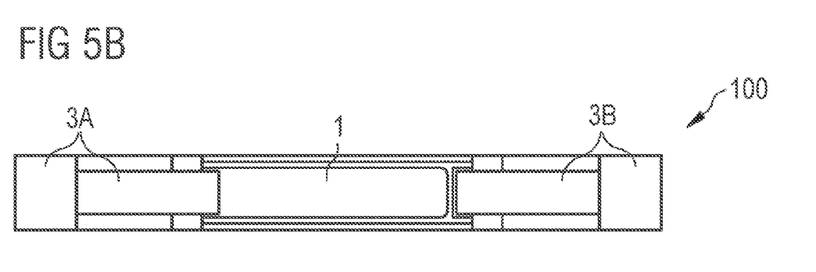
FIG. 5B shows a schematic top view of the radiation-passage-side surface of an optoelectronic semiconductor component according to a further exemplary embodiment.

In the exemplary embodiment of an optoelectronic semiconductor component 100 represented in connection with FIGS. 5A and 5B, the rear surface 1C is completely covered by molding compound. The shaped body 2 comprises no interfaces in its interior. Furthermore, the contact layers 3A, 3B are each arranged only on the radiation-passage-side main area 2A, on the lateral faces 2B and on the rear main area 2C of the shaped body 2. Moreover, both contact layers 3A, 3B extend on the radiation-passage-side main area 2A as far as the semiconductor chip 1. In this exemplary embodiment the rear surface 1C of the semiconductor chip 1 remains not covered by the contact layers 3A, 3B.

FIGS. 6A to 6F show various steps of a method according to a first exemplary embodiment for producing an optoelectronic semiconductor component as described herein.

Figure 6A:
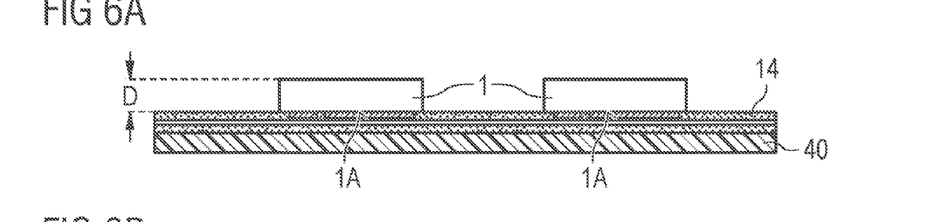
FIGS. 6A to 6F and 7A to 7C and 8A to 8C show various method steps according to various exemplary embodiments of a method.

FIG. 6A shows an initial step of the method, wherein a composite consisting of several optoelectronic semiconductor chips 1 is made available. The semiconductor chips 1 are arranged with their radiation passage faces 1A on a common support 40. The semiconductor chips 1 may be fastened to the support 40, for example, by means of an adhesive film 14.

Figure 6B:
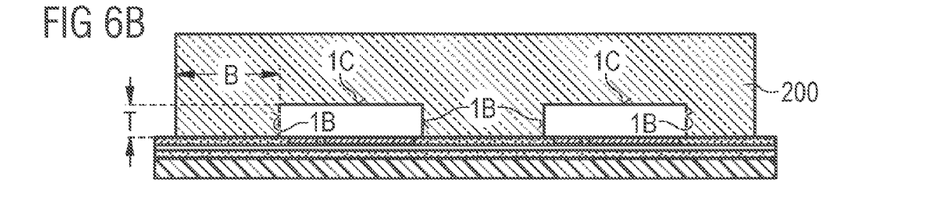

FIG. 6B shows a next step, wherein the optoelectronic semiconductor chips 1 are embedded in molding compound 200. In particular, in this case the lateral faces 1B and rear surfaces 1C of the semiconductor chips 1 are covered by the molding compound 200, whereby projecting portions are formed which are arranged on lateral faces 1B of the semiconductor chips 1 and which each comprise a first dimension T and a second dimension B which are each larger than a smallest dimension D of the semiconductor chips 1 (see FIG. 6A).

Figure 6C:
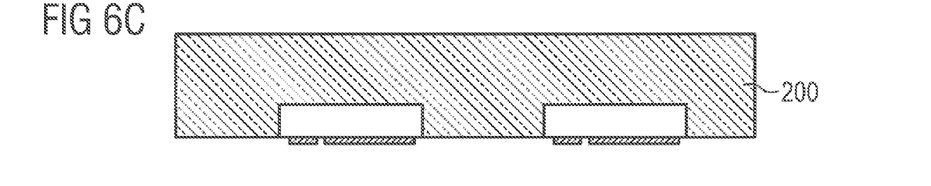

FIG. 6C shows a further method step, wherein the common support 40 is detached.

Figure 6D:
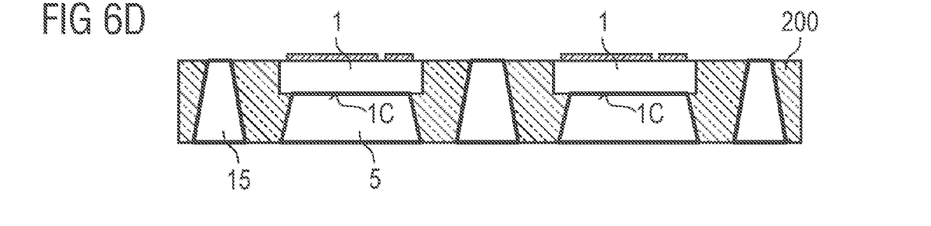

In the method step represented in FIG. 6D, various openings 5, 15 are formed in the molding compound 200.

The openings 15 extend from a first main area of the molding compound 200 as far as a second main area and are each arranged between two adjacent semiconductor chips 1. The openings 15 enable a division of the composite into several optoelectronic semiconductor components. The openings 5 each extend from the second main area of the molding compound as far as the rear surfaces 1C of the optoelectronic semiconductor chips 1. In particular, the openings 5, 15 are generated in the molding compound 200 by means of laser ablation.

Figure 6E:
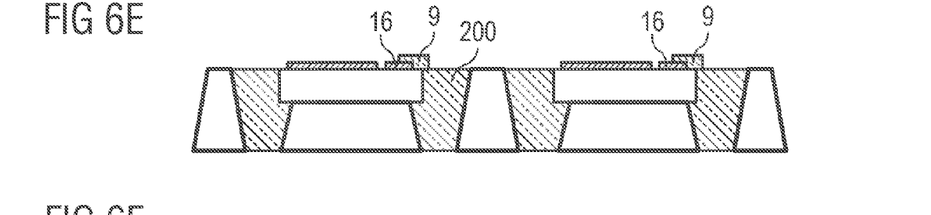

FIG. 6E shows a method step wherein a passivation layer 9 is applied onto each of the semiconductor chips 1. In particular, the passivation layer 9 is applied on the edge of the semiconductor chip 1, so that the second contact 16 is partly covered by the passivation layer 9.

Figure 6F:
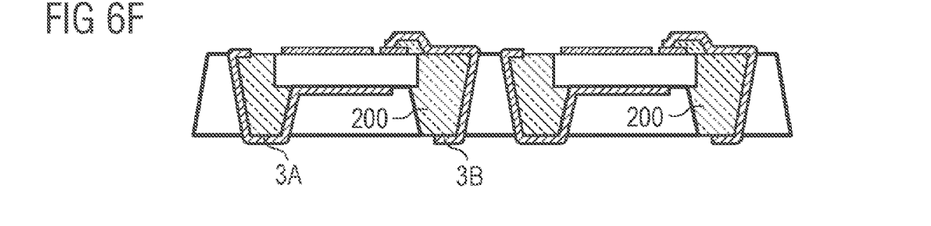

FIG. 6F shows a further method step wherein first and second metallizations are applied onto the molding compound 200 for forming the first and second contact layers 3A, 3B. In particular, the metallizations are generated galvanically, wherein firstly a seed layer can be applied, on which a metal layer is electrodeposited.

In a subsequent method step the composite can be separated along the openings 15 into several optoelectronic semiconductor components (not represented).

Figure 7A:
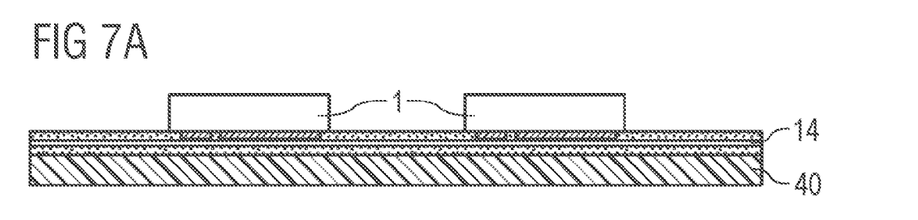
Figure 7B:
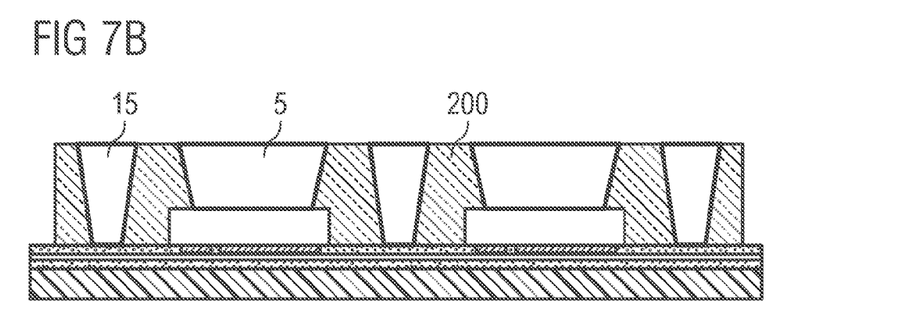
Figure 7C:
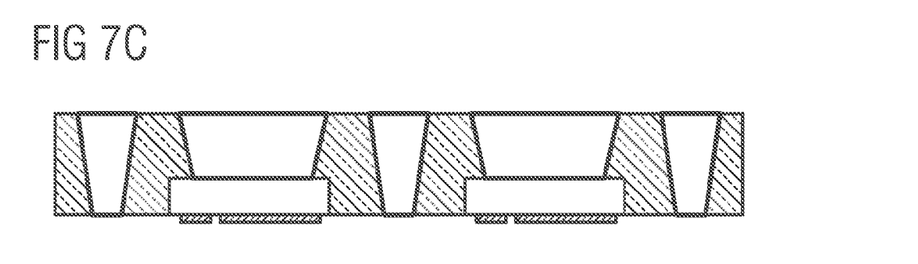

FIGS. 7A to 7C show first steps of a method according to a second exemplary embodiment, wherein the method step represented in FIG. 7A is preferentially undertaken in accordance with the method step represented in FIG. 6A. However, the openings 5, 15 are formed not by removing the molding compound 200, as represented in FIGS. 6C and 6D, but by means of recessing of the molding compound in the regions of the composite that are to remain free of molding compound 200. In this case, the molding compound 200 is already applied as an interrupted layer. In the case of the method according to the second exemplary embodiment, the common support 40 is preferentially detached only when the molding compound provided with openings 5, 15 is applied onto the semiconductor chips 1 (see FIGS. 7B and 7C). The further method steps, such as applying passivation layers and applying metallizations, are preferentially undertaken in accordance with the method steps described in connection with FIGS. 6E and 6F.

Figure 8A:
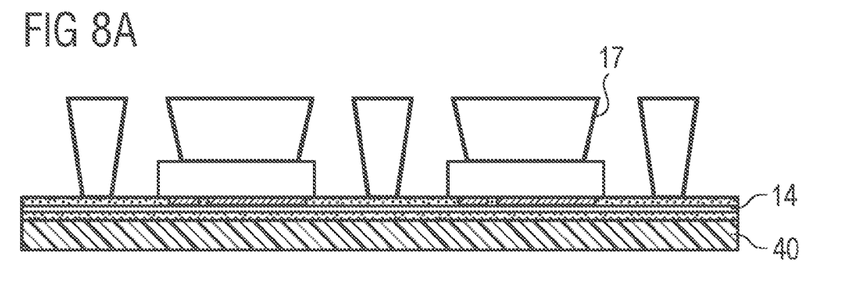
Figure 8B:
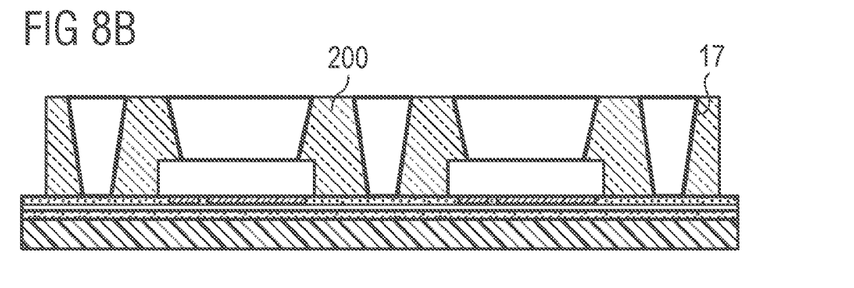
Figure 8C:
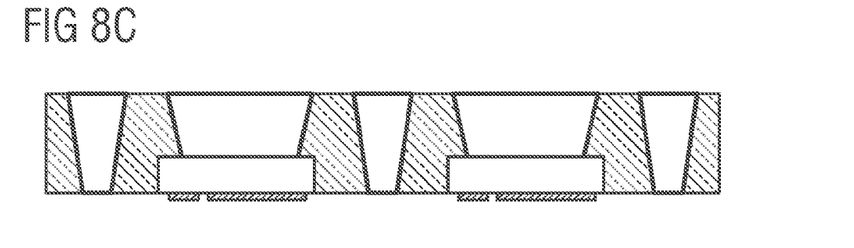

A third exemplary embodiment of a method is represented in connection with FIGS. 8A to 8C. In this case, for generating the openings 5, 15 use is made of a structured sacrificial layer 17, for example, a photoresist layer, which is arranged in the regions of the composite where the openings 5, 15 are to be formed. Molding compound 200 is arranged in interstices of the sacrificial layer 17. Subsequently the sacrificial layer 17 is dissolved out, so that the openings in the molding compound 200 are formed (not represented). The common support 40 may already be removed prior to the removal of the sacrificial layer 17 (see FIG. 8C). The further method steps, such as applying passivation layers and applying metallizations, are preferentially undertaken in accordance with the method steps described in connection with FIGS. 6E and 6F.

Figure 9A:
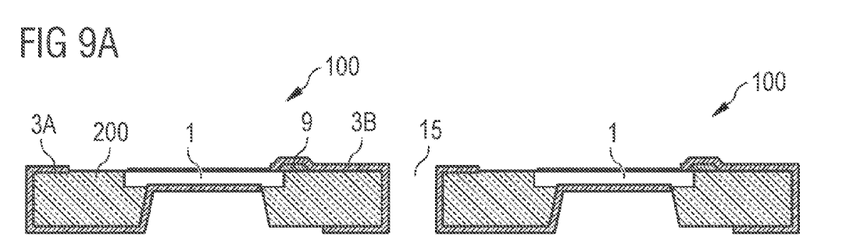
FIG. 9A shows a schematic cross-sectional view of this composite.
Figure 9B:
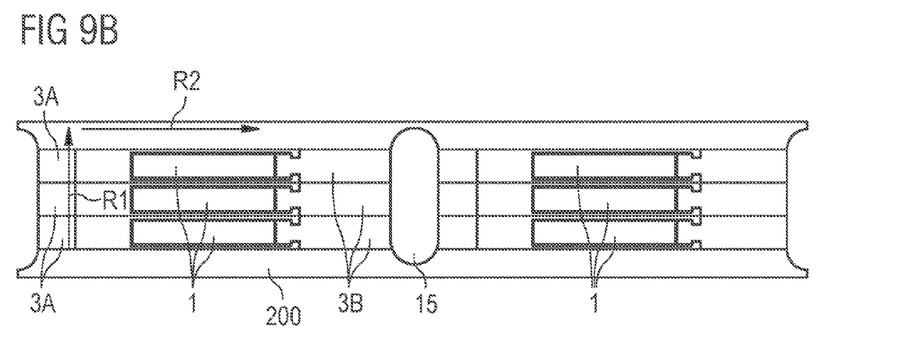
FIG. 9B shows a schematic top view of a composite consisting of semiconductor chips.

An exemplary embodiment of a composite consisting of semiconductor chips 1 is shown in FIG. 9B in top view and in FIG. 9A in a cross-sectional view along the dashed line represented in FIG. 9B.

In a first direction R1 the semiconductor chips 1 are arranged in rows, each two adjacent semiconductor chips 1 is connected to one another by means of molding compound 200. In a second direction R2 arranged orthogonally to the first, the semiconductor chips 1 are also arranged in rows, each two adjacent semiconductor chips 1 of a row is separated from one another by an opening 15. The opening 15 comprises first and second metallizations for forming first and second contact layers 3A, 3B. In particular, one opening 15 severs several rows of semiconductor chips 1. The semiconductor chips 1 of the outer rows are connected to one another along the second direction R2 in each instance by an edge consisting of molding compound 200. A division of the composite is preferentially undertaken parallel to the first and second directions R1, R2, wherein the edges consisting of molding compound 200 and also the connections formed from molding compound 200 between the semiconductor chips 1 are severed, and consequently a plurality of optoelectronic semiconductor components 100 is formed.

The invention is not restricted by the description on the basis of the exemplary embodiments. Rather, the invention encompasses each new feature and also each combination of features, including, in particular, each combination of features in the claims, even if this feature or this combination itself is not specified explicitly in the claims or exemplary embodiments.

The invention claimed is:

1. An optoelectronic semiconductor component comprising:
   an optoelectronic semiconductor chip comprising a radiation passage face through which a majority of radiation into or out of the optoelectronic semiconductor chip passes, a plurality of lateral faces arranged transversely in relation to the radiation passage face, and a rear surface arranged opposite the radiation passage face;
   a shaped body comprising a radiation-passage-side main area, a plurality of lateral faces, and a rear main area, wherein the optoelectronic semiconductor chip is partly embedded into the shaped body, wherein the shaped body comprises an opening that extends from the rear surface of the optoelectronic semiconductor chip as far as the rear main area of the shaped body, and wherein the shaped body is formed from a molding compound that at least partly covers at least two lateral faces and the rear surface of the optoelectronic semiconductor chip;

a first contact layer and a second contact layer arranged on the shaped body and are electrically connected to the optoelectronic semiconductor chip;

a mounting face arranged transversely in relation to the radiation passage face and is provided for mounting the optoelectronic semiconductor component, the shaped body comprising a projecting portion that is arranged on a lateral face of the optoelectronic semiconductor chip and comprises a first dimension and a second dimension, which are each larger than a smallest dimension of the optoelectronic semiconductor chip; and a filling arranged in the opening, wherein the first contact layer is arranged in the opening between the filling and the shaped body.

2. The optoelectronic semiconductor component according to claim 1, wherein the radiation passage face of the optoelectronic semiconductor chip and the radiation-passage-side main area of the shaped body each form a part of a radiation-passage-side surface of the optoelectronic semiconductor component, which bounds the optoelectronic semiconductor component toward the outside on its radiation passage side.

3. The optoelectronic semiconductor component according to claim 1, wherein the first dimension and the second dimension of the projecting portion are at least twice as large as the smallest dimension of the optoelectronic semiconductor chip.

4. The optoelectronic semiconductor component according to claim 1, wherein the first and the second contact layers extend from the radiation-passage-side main area respectively onto a lateral face of the shaped body that is arranged transversely in relation to the mounting face.

5. The optoelectronic semiconductor component according to claim 1, wherein the opening is bounded on its underside by the rear surface of the optoelectronic semiconductor chip, and peripherally at least partly by at least one internal surface of the shaped body.

6. The optoelectronic semiconductor component according to claim 1, wherein the first contact layer extends from the rear main area of the shaped body into the opening.

7. The optoelectronic semiconductor component according to claim 6, wherein the first contact layer is applied onto an internal surface of the shaped body and onto the rear surface of the optoelectronic semiconductor chip.

8. The optoelectronic semiconductor component according to claim 1, wherein the shaped body is formed in a single layer.

9. The optoelectronic semiconductor component according to claim 1, wherein at least a part of the mounting face of the optoelectronic semiconductor component is formed by a lateral face of the shaped body, and wherein at least one of the first and second contact layers extends onto the lateral face.

10. The optoelectronic semiconductor component according to claim 1, wherein a part of the mounting face of the optoelectronic semiconductor component is formed by a lateral face of the optoelectronic semiconductor chip.

11. A method for producing a plurality of optoelectronic semiconductor components, the method comprising:

providing a composite comprising a plurality of optoelectronic semiconductor chips, each semiconductor chip comprising a radiation passage face through which a majority of radiation into or out of the optoelectronic semiconductor chip passes, a plurality of lateral faces arranged transversely in relation to the radiation passage face, and a rear surface arranged opposite the radiation passage face, the plurality of optoelectronic semiconductor chips arranged with their radiation passage faces on a common support;

embedding the optoelectronic semiconductor chips into a molding compound, so that the lateral faces and rear surfaces of the semiconductor chips are covered by the molding compound, wherein a projecting portion of the molding compound is assigned to each semiconductor chip, the projecting portion being arranged on a lateral face of the semiconductor chip and comprising a first and a second dimension that are each larger than a smallest dimension of the semiconductor chip;

detaching the common support;

applying first and second metallizations onto the molding compound to form first and second contact layers; and separating the molding compound into a plurality of optoelectronic semiconductor components that each include a respective semiconductor chip and a shaped body, wherein each semiconductor component has a mounting face arranged transversely in relation to the radiation passage face, wherein the mounting face is provided for mounting the semiconductor component, and wherein each semiconductor component comprises a first contact layer and a second contact layer extending from a radiation-passage-side main area respectively onto a lateral face of the shaped body that is arranged transversely in relation to the mounting face.

12. The method according to claim 11, wherein openings are formed in the molding compound, the openings extending as far as the rear surfaces of the optoelectronic semiconductor chips.

13. The method according to claim 12, wherein the molding compound is applied as a closed layer and the openings are generated by removing the molding compound by laser ablation.

14. The method according to claim 12, wherein the molding compound is applied as an interrupted layer.

15. An optoelectronic semiconductor component comprising:

an optoelectronic semiconductor chip comprising a radiation passage face through which a majority of radiation into or out of the optoelectronic semiconductor chip passes, a plurality of lateral faces arranged transversely in relation to the radiation passage face, and a rear surface arranged opposite the radiation passage face;

a shaped body comprising a radiation-passage-side main area, a plurality of lateral faces, and a rear main area, wherein the optoelectronic semiconductor chip is partly embedded into the shaped body, and the shaped body is formed from a molding compound that at least partly covers at least two lateral faces and the rear surface of the optoelectronic semiconductor chip;

a first contact layer and a second contact layer arranged on the shaped body and are electrically connected to the optoelectronic semiconductor chip; and a mounting face arranged transversely in relation to the radiation passage face and is provided for mounting the optoelectronic semiconductor component, the shaped body comprising a projecting portion that is arranged on a lateral face of the optoelectronic semiconductor chip and comprises a first dimension and a second dimension, which are each larger than a smallest dimension of the optoelectronic semiconductor chip, wherein the first and the second contact layer extend from the radiation-passage-side main area respectively onto a lateral face of the shaped body that is arranged transversely in relation to the mounting face.

16. The optoelectronic semiconductor component according to claim 15, wherein the lateral face of the shaped body is an outermost surface of the shaped body.

17. The optoelectronic semiconductor component according to claim 15, further comprising a third contact layer, wherein the shaped body is formed in two layers and the third contact layer is arranged between a first and a second layer of the shaped body.

18. The optoelectronic semiconductor component according to claim 17, wherein the first contact layer and the rear surface of the optoelectronic semiconductor chip are connected to one another by the third contact layer.

* * * * *